United States Patent
Itonaga

(10) Patent No.: US 8,593,553 B2
(45) Date of Patent: Nov. 26, 2013

(54) SOLID-STATE IMAGING DEVICE AND ELECTRONIC APPARATUS

(75) Inventor: Kazuichiro Itonaga, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/408,393

(22) Filed: Feb. 29, 2012

(65) Prior Publication Data

US 2012/0154657 A1 Jun. 21, 2012

Related U.S. Application Data

(62) Division of application No. 12/491,740, filed on Jun. 25, 2009, now Pat. No. 8,169,523.

(30) Foreign Application Priority Data

Jun. 27, 2008 (JP) ................................. 2008-169447

(51) Int. Cl.
*H04N 5/335* (2011.01)

(52) U.S. Cl.
USPC .......................... 348/308; 250/208.1; 348/241

(58) Field of Classification Search
USPC ................................. 348/308, 241; 250/208.1
See application file for complete search history.

(56) References Cited

U.S. PATENT DOCUMENTS

| | | | | |
|---|---|---|---|---|
| 5,899,714 A | * | 5/1999 | Farrenkopf et al. | 438/202 |
| 7,235,826 B2 | * | 6/2007 | Ezaki et al. | 257/225 |
| 7,518,143 B2 | * | 4/2009 | Sugawa | 257/59 |
| 2003/0228736 A1 | * | 12/2003 | Kimura | 438/286 |
| 2005/0036051 A1 | * | 2/2005 | Ueno et al. | 348/308 |
| 2009/0194799 A1 | * | 8/2009 | Lee et al. | 257/292 |

FOREIGN PATENT DOCUMENTS

| | | |
|---|---|---|
| JP | HEI 11-284167 A | 10/1999 |
| JP | 2000-091552 A | 3/2000 |
| JP | 2002-217397 | 8/2002 |
| JP | 2003-101004 A | 4/2003 |
| JP | 2004-273640 A | 9/2004 |
| JP | 2006-032681 | 2/2006 |
| JP | 2008-166607 A | 7/2008 |

* cited by examiner

*Primary Examiner* — Tuan Ho
*Assistant Examiner* — Zhenzhen Wu
(74) *Attorney, Agent, or Firm* — Sheridan Ross P.C.

(57) ABSTRACT

A solid-state imaging device including a photoelectric conversion portion; a floating diffusion region; a transfer gate electrode made of an n-type semiconductor; a sidewall made of an n-type semiconductor formed on the photoelectric conversion portion side of the transfer gate electrode with an insulating film therebetween; and a sidewall made of an insulating layer formed on the floating diffusion region side of the transfer gate electrode.

6 Claims, 13 Drawing Sheets

SOLID-STATE IMAGING DEVICE AND ELECTRONIC APPARATUS

RELATED APPLICATION DATA

This application is a division of U.S. patent application Ser. No. 12/491,740, filed Jun. 25, 2009, the entirety of which is incorporated herein by reference to the extent permitted by law. The present application claims the benefit of priority to Japanese Patent Application No. 2008-169447 filed in the Japan Patent Office on Jun. 27, 2008, the entirety of which is incorporated by reference herein to the extent permitted by law.

BACKGROUND OF THE INVENTION

The present invention relates to a solid-state imaging device and an electronic apparatus including the solid-state imaging device.

The solid-state imaging device is largely divided into a charge-transfer type solid-state imaging device typified by a CCD (Charge Coupled Device) image sensor and an amplification-type solid-state imaging device typified by a MOS-type image sensor such as a CMOS (Complementary Metal Oxide Semiconductor) image sensor. When comparing the CCD image sensor with the MOS-type image sensor, high drive voltage is necessary for transferring signal charges in the CCD image sensor, therefore, it is inevitable that power supply voltage becomes high as compared with the MOS-type image sensor.

Accordingly, as a solid-state imaging device loaded on mobile equipment such as a cellular phone with a camera or a PDA (Personal Digital Assistant) in recent years, the MOS-type image sensor is used in various applications, in which power supply voltage is lower than the CCD image sensor and advantageous as compared with the CCD image sensor from the viewpoint of power consumption and the like.

In the MOS-type image sensor, a unit pixel includes a photodiode which is a photoelectric conversion portion and plural MOS transistors, and the MOS-type image sensor is formed by including an imaging region in which plural unit pixels are arranged in an array and a peripheral circuit region.

FIG. 15 shows a relevant part of a charge readout portion of a pixel in a common MOS-type image sensor. In the pixel, a photodiode 102 to be a photoelectric conversion portion and an n-type semiconductor region, namely, a floating diffusion region 103 to which signal charges of the photodiode 102 are read are formed on a semiconductor substrate 101. Between the photodiode 102 and a floating diffusion region 103, a transfer transistor Tr1 in which a gate electrode (so-called transfer gate electrode) 105 is formed through a gate insulating film 104 is formed, where a charge readout portion is formed.

The photodiode 102 is constructed as a buried photodiode including an n-type semiconductor region 107 to be a charge accumulation region and a p-type semiconductor region, a so-called p-type accumulation layer 108 formed at an interface portion at the surface thereof. The photodiode 102 is constructed as a so-called HAD (Hole Accumulation Diode) sensor. At a sidewall of the gate electrode 105, a side wall 106 made by an insulation layer is formed.

During a charge accumulation period, 0V is applied to the gate electrode 105 to allow the transfer transistor Tr1 to be in OFF-state, thereby accumulating signal charges in the photodiode 102. At the time of readout, positive voltage is applied to the gate electrode 105 to transfer signal charges accumulated in the photodiode 102 to the floating diffusion region 103.

In the photodiode 102, signal charges according to the incident light amount and dark current components (dark electrons) flowing into the photodiode 102 even when light is not incident are accumulated during the charge accumulation period. The dark electrons are electrons generated from an interface between the insulating film and the silicon region under the gate electrode 105, which will be fixed pattern noise to be a cause of generating white spots.

As a technique for improving the above problem, a MOS image sensor which reduces dark current by applying negative voltage to the gate electrode of the transfer transistor during the charge accumulation period which is disclosed in JP-A-2002-217397 (Patent Document 1) is proposed. The MOS image sensor has a configuration in which a negative voltage –V is applied to the gate electrode 105 of the transfer transistor Tr1 during the charge accumulation period as shown in FIG. 16. In the configuration, holes (positive holes) "h" are induced just under the gate electrode 105 to allow the transfer transistor Tr1 to be in OFF state by applying the negative voltage –V to the gate electrode 105, and holes "h" are also induced just under the sidewall 106 in the vicinity of the gate electrode 105 by fringe capacitance at the same time. That is, a hole pinning mode is generated electrically just under the gate electrode 105 and just under the sidewall 106 in the vicinity of the gate electrode 105. According to this, electrons generated from the interface between the gate insulating film 104 as well as the sidewall 106 in the vicinity thereof and the silicon region are made to be coupled again with the holes "h" to thereby suppress white spots.

Additionally, a MOS image sensor is proposed in JP-A-2006-32681 (Patent Document 2), in which the gate electrode of the transfer transistor is made of p-type polysilicon which has the work function difference with respect to an intrinsic semiconductor to suppress generation of dark current from the interface of the transfer transistor even when negative voltage is not introduced.

In the case that signal charges in the photodiode 102 are read to the floating diffusion region 103, when the p-type accumulation layer 108 comes close to the gate electrode 105, a readout voltage Vtg of the transfer transistor Tr1 becomes high, therefore, it becomes difficult to read signal charges. FIG. 3C shows a potential distribution before reading signal charges and a potential distribution at the time of readout. In the configuration of the normal charge readout portion in FIG. 15, a potential "a" before readout is modulated by applying a readout voltage to the gate electrode 105 of the transfer transistor Tr1 to thereby read signal charges in the photodiode 102. At this time, when the readout voltage is low, a potential barrier "c" is formed just under the sidewall 106 as shown in FIG. 3C, as a result, it is difficult to read signal charges. In order to make the readout of signal charges easy, readout voltage which is sufficiently high to break the potential barrier "c" is necessary. FIG. 3A corresponds to a readout portion in a related art example.

In the MOS solid-state imaging device, improvement of readout characteristics is expected in recent years.

In order to make the readout of signal charges easy, it is considered that the high-concentration p-type accumulation layer 108 is kept away from the gate electrode 105, however, it induces white spots. When the p-type accumulation layer 108 is closed to the gate electrode 105 to suppress generation of white spots, the readout voltage becomes high. To improve readout characteristics and to suppress generation of white spots contradict to each other.

Considering relation between readout characteristics and a saturated charge amount (maximum handling charge amount) Qs of the photodiode, when the concentration of the n-type semiconductor region of the photodiode is high, Qs becomes high, however, it is difficult to read signal charges. When the concentration of the n-type semiconductor region is made high, the increase of white spots is induced.

SUMMARY OF THE INVENTION

It is desirable to provide a solid-state imaging device which realized improvement of readout characteristics and an electronic apparatus including the solid-state imaging device.

A solid-state imaging device according to an embodiment of the invention includes a photoelectric conversion portion, a floating diffusion region, a transfer gate electrode made of an n-type semiconductor, a sidewall made of an n-type semiconductor formed on the photoelectric conversion portion side of the transfer gate electrode through an insulating film and a sidewall made of an insulating layer formed on the floating diffusion region side of the transfer gate electrode.

In the solid-state imaging device according to the embodiment of the invention, the sidewall made of the n-type semiconductor is formed on the photoelectric conversion portion side of the transfer gate electrode made of the n-type semiconductor through the insulating film, therefore, when a readout voltage is applied to the transfer gate electrode, the readout voltage is also applied to the sidewall made of the n-type semiconductor due to coupling capacitance. Accordingly, the potential of the photoelectric conversion portion just under the sidewall is gently modulated without forming a barrier, and readout of signal charges in low voltage can be performed. Also in the configuration, regions under the n-type transfer gate electrode and just under the n-type sidewall are in the hole pinning mode at the time of accumulating charges, which suppresses generation of white spots.

A solid-state imaging device according to another embodiment of the invention includes a photoelectric conversion portion including a first photodiode and a second photodiode in a unit pixel, in which the second photodiode is positioned in the vicinity of a transfer gate electrode and has higher impurity concentration than the first photodiode.

In the solid-state imaging device according to the embodiment of the invention, the photoelectric conversion portion includes the first photodiode and the second photodiode, in which the second photodiode has higher impurity concentration than the first photodiode as well as formed in the vicinity of the transfer gate electrode. According to the configuration, signal charges are accumulated in the second photodiode positioned in the vicinity of the transfer gate electrode, therefore, it becomes easy to read signal charges. Also in the configuration, since the second photodiode having higher impurity concentration is included, the saturated charge amount Qs can be increased.

An electronic apparatus according to another embodiment of the invention includes a solid-state imaging device, an optical system which guides incident light to photoelectric conversion portions of the solid-state imaging device and a signal processing circuit which processes output signals of the solid-state imaging device, in which the solid-state imaging device is constructed by any of the solid-state imaging devices according to the embodiments of invention.

In the electronic apparatus according to the embodiment of the invention, it is possible to read signal charges in low voltage by providing with the solid-state imaging device according to the embodiment of the invention. It is also possible to suppress generation of white spots or realize improvement of the saturated charge amount.

In the solid-state imaging device according to the embodiment of the invention, readout characteristics of signal charges can be improved.

In the electronic apparatus according to the embodiment of the invention, readout characteristics of signal charges in the solid-state imaging device can be improved.

DESCRIPTION OF THE PREFERRED EMBODIMENTS

Hereinafter, embodiments of the invention will be explained with reference to the drawings.

Figure 1:
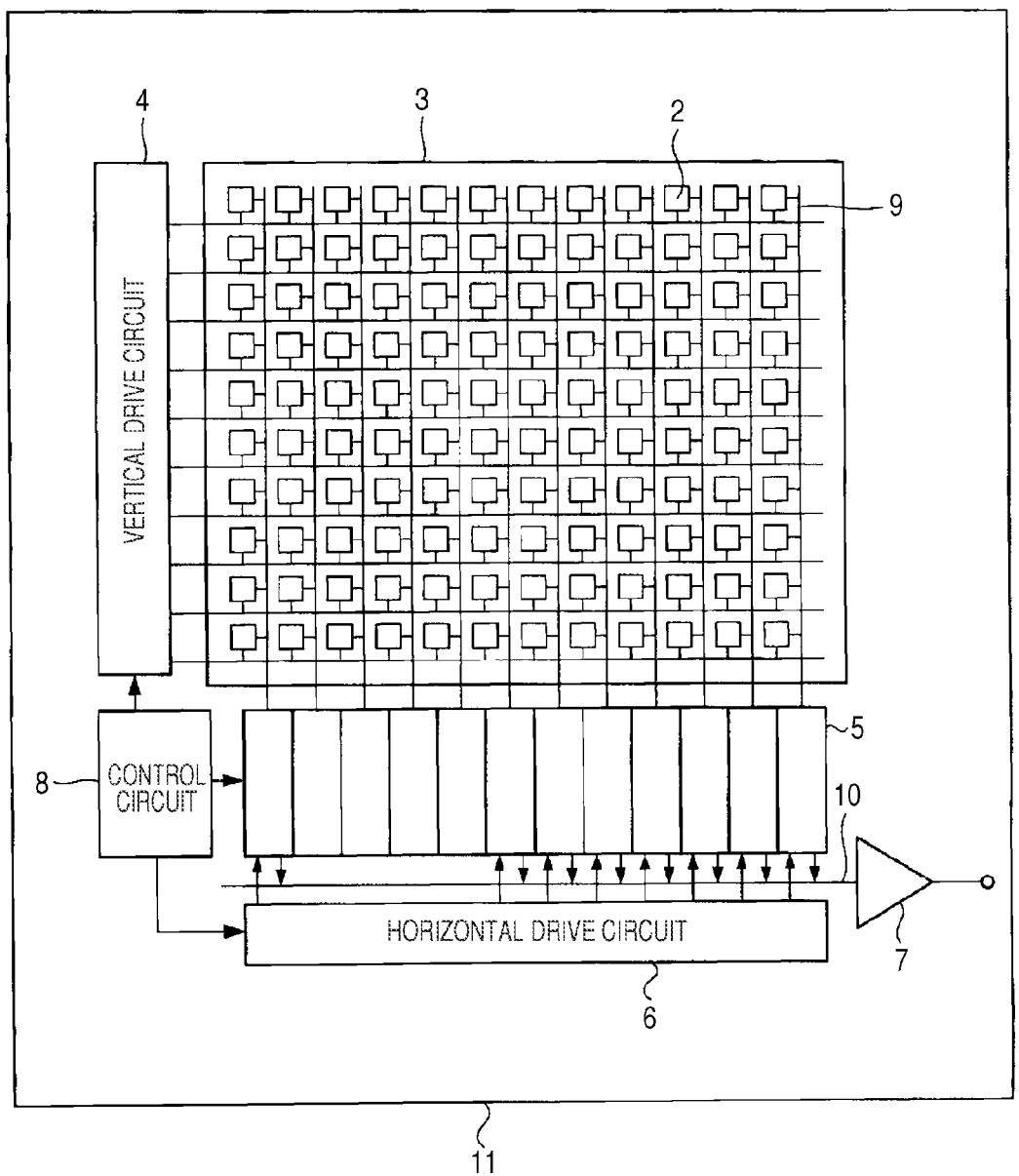
FIG. 1 is a schematic configuration view showing an example of a MOS-type solid-state imaging device to which the invention is applied.

FIG. 1 shows a schematic configuration of an example of a solid-state imaging device, namely, a MOS-type solid-state imaging device which is applied to the invention. A solid-state imaging device 1 as the example includes a pixel portion (so-called imaging region) 3 in which pixels 2 including plural photoelectric conversion elements are two-dimensionally arranged regularly and a peripheral circuit portion on a semiconductor substrate 11, for example, a silicon substrate. The pixel 2 includes, for example, a photodiode to be the photoelectric conversion element and plural pixel transistors (so-called MOS transistors). Plural pixel transistors may include three transistors, for example, a transfer transistor, a reset transistor and an amplification transistor, or may include four transistors by adding, for example, a selection transistor. Since an equivalent circuit of these unit pixels is the same as the normal circuit, the detailed explanation will be omitted.

The peripheral circuit portion includes a vertical drive circuit 4, column signal processing circuits 5, a horizontal drive circuit 6, an output circuit 7, a control circuit 8 and the like.

The control circuit 8 generates a clock signal and a control signal which are references of operation of the vertical drive circuit 4, the column signal processing circuits 5, the horizontal drive circuit 6 and the like based on a vertical synchronizing signal, a horizontal synchronizing signal and a master clock, and inputs these signals to the vertical drive circuit 4, the column signal processing circuits 5, the horizontal drive circuit 6 and the like.

The vertical drive circuit 4 includes, for example, a shift register, selectively scanning respective pixels 2 in the pixel portion 3 sequentially in the vertical direction by the row and supplying pixel signals based on signal charges generated in, for example, the photodiodes to be the photoelectric conversion elements of respective pixels 2 in accordance with the amount of received light to the column signal processing circuits 5 through vertical signal lines 9.

The column signal processing circuit 5 is disposed, for example, by each column of pixels 2, performing signal processing such as noise elimination of signals outputted from pixels 2 of one row by each pixel column based on signals from black reference pixels (formed around a valid pixel region). That is, the column signal processing circuit 5 performs signal processing of, for example, an S/H (sample and hold) circuit, a CDS (Correlated Double Sampling) circuit, signal amplification and the like for eliminating fixed pattern noise peculiar to the pixels 2. At output stages of the column signal processing circuits 5, horizontal selection switches (not shown) are provided, being connected between the column signal processing circuits 5 and the horizontal signal line 10.

The horizontal drive circuit 6 includes, for example, a shift register, selecting respective column signal processing circuits 5 in order by sequentially outputting horizontal scanning pulses and allowing respective column signal processing circuits 5 to output pixel signals to the horizontal signal line 10.

The output circuit 7 performs signal processing to signals sequentially supplied from respective column signal processing circuits 5 through the horizontal signal line 10 and outputting the signals.

Above the substrate 11 on which the pixel portion 3 and the peripheral circuit portion are formed, a multi-wiring layer is formed through an interlayer insulating film. In the pixel portion 3, an on-chip color filter is formed on the multi-wiring layer through a planarizing layer, and an on-chip micro-lens is formed further thereon. At regions other than the pixel portion in the imaging region, more particularly, at the peripheral circuit portion and other regions other than the photodiodes in the imaging region (so-called light receiving portion), a shielding film is formed. The shielding film can be made of, for example, a wiring layer of the top layer of the multi-wiring layer.

Next, an embodiment of the invention applied to a so-called readout portion including a photoelectric conversion portion, a floating diffusion region and a transfer transistor in the above unit pixel 2 will be explained.

Figure 2:
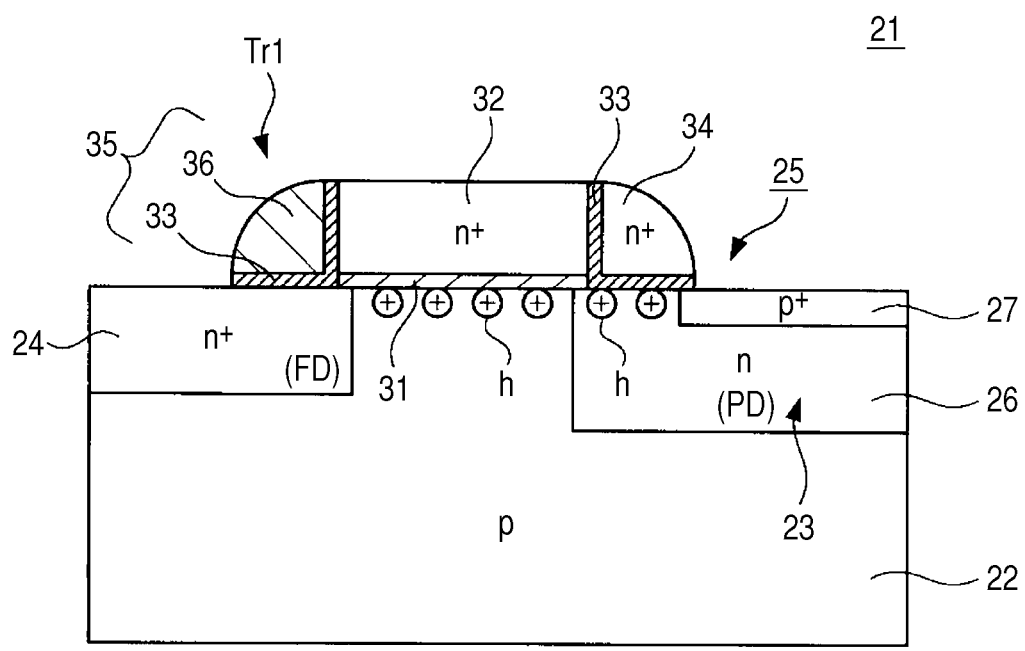
FIG. 2 is a configuration view showing a solid-state imaging device according to a first embodiment of the invention.

FIG. 2 shows a solid-state imaging device according to a first embodiment of the invention, particularly shows a readout portion according to the first embodiment. In a solid-state imaging device 21 according to the embodiment, a readout portion 25 including a photodiode (PD) 23 to be a photoelectric conversion portion, a floating diffusion region (FD) 24 which is a second-conductivity n-type semiconductor region and a transfer transistor Tr1 is formed at a region of each unit pixel in a first-conductivity type, namely, p-type semiconductor substrate 22 in the example.

The photodiode 23 is constructed as a buried photodiode including a second-conductivity, namely, n-type semiconductor region 26 and a p-type accumulation layer 27 on the surface thereof. The transfer transistor Tr1 is constructed by forming a transfer gate electrode (hereinafter, referred to an n+gate electrode) 32 made of an n-type semiconductor, namely, polysilicon on the substrate surface between the photodiode and the floating diffusion region 24 through a gate insulating film 31. In the transfer transistor Tr1, the photodiode 23 will be a source region and the floating diffusion region 24 will be a drain region. The gate insulating film 31 is made of, for example, a silicon oxide film.

Further, on the photodiode 23 side of the n+gate electrode 32, a sidewall 34 made of an n-type semiconductor, namely, polysilicon (hereinafter, referred to as an n+poly-sidewall) is formed through an insulating film 33, which is, for example, the silicon oxide film. On the floating diffusion region 24 side of the n+gate electrode 32, a sidewall 35 made of an insulating layer (hereinafter, referred to as an insulating sidewall) is formed. The insulating sidewall 35 has a two-layer structure in the example, including, for example, two layers of the silicon oxide film 33 and a silicon nitride layer 36. The insulating sidewall 35 may also be formed in a one-layer structure or in a multi-layer structure of two or more layers.

The n+poly-sidewall 34 is formed so as to correspond to the n-type semiconductor region 26 of the photodiode 23. The n-type semiconductor region 26 is formed so that part thereof overlaps with the n+gate electrode 32, and the p-type accumulation layer 27 is formed so that part thereof overlaps with the n+poly-sidewall 34. The floating diffusion region 24 is formed so that part thereof overlaps with part of the n+gate electrode 32, passing through the insulating sidewall 35.

Figure 3A:
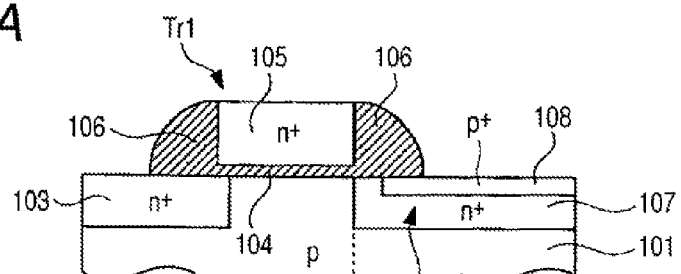
FIG. 3A is a cross-sectional view of a readout portion of related art.
Figure 3B:
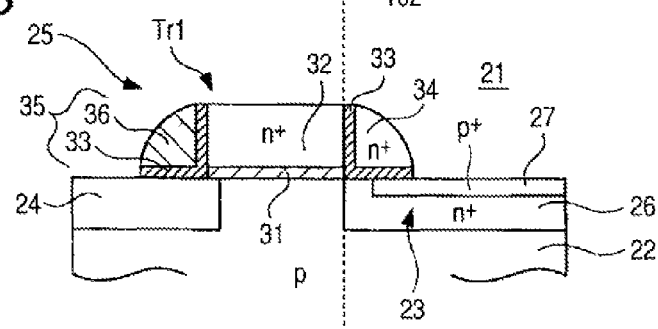
FIG. 3B is a cross-sectional view of a readout portion of the first embodiment of the invention.
Figure 3C:
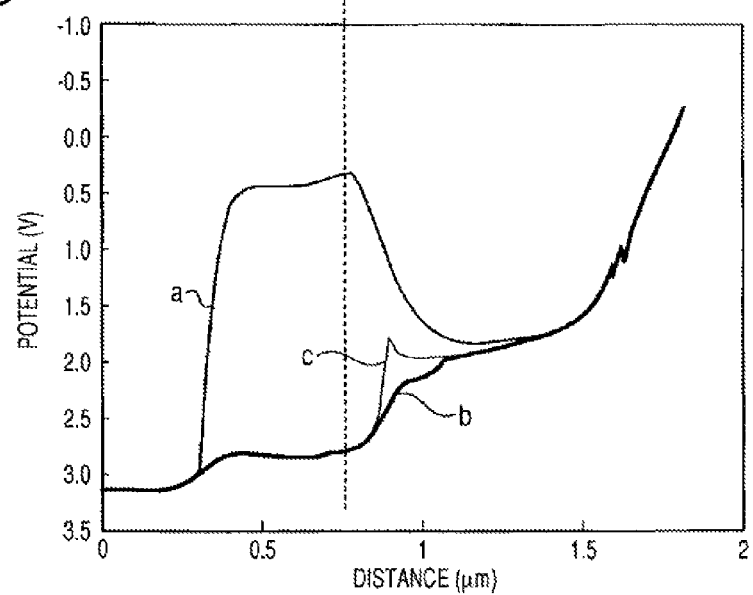
FIG. 3C shows a graph of potential distributions before readout and at the time of readout.

In the solid-state imaging device 21 according to the first embodiment, at the time of reading charges when signal charges are read from the photodiode 23 to the floating diffusion region 24, positive voltage is applied to the n+gate electrode 32. The positive voltage is also applied to the n+poly-sidewall 34 by coupling capacitance. The gate voltage is applied to the n+poly-sidewall 34, thereby modulating potential of the n-type semiconductor region 26 of the photodiode 23 just below. The modulation of potential is performed so that, as shown in a potential distribution "b" at the time of readout in FIG. 3C, a potential barrier "c" is broken and the potential distribution "b" has a gentle slope just under the n+poly-sidewall 34. FIG. 3B corresponds to the readout portion 25 of the embodiment. It becomes easy to read charges because of the potential distribution "b" which has the gentle slope, which enables readout of signal charges in low voltage. In short, readout characteristics are improved.

During an accumulation period of signal charges, negative voltage is applied to the n+gate electrode 32. Since the negative voltage is also applied to the n+poly-sidewall 34 by coupling capacitance, holes "h" are induced at a surface of the n-type semiconductor region 26 in the photodiode 23 just under the n+poly-sidewall 34. That is, the surface of the n-type semiconductor region 26 just under the n+poly-sidewall 34 is in a so-called hole pinning mode. At the same time, a channel surface just under the n+gate electrode 32 is also in the hole pinning mode. The channel surface and the surface of the n-type semiconductor region 26 in the photodiode 23 just under the n+poly-sidewall 34 are in the hole pinning mode, therefore, electrons generated from an insulating film interface are coupled with holes "h" again, which suppresses generation of white spots.

The sidewall 35 on the floating diffusion region 24 side is made of the insulating side wall, therefore, capacitance of the floating diffusion region 24 can be reduced and conversion efficiency can be improved. The capacitance of the floating diffusion region 24 in this case is overlap capacitance of the floating diffusion region 24 and the sidewall 35, and for example, in the case that the sidewall 35 is made of the poly-sidewall in the same manner as the photodiode 23 side, the overlap capacitance becomes large and conversion efficiency is reduced.

Figure 4:
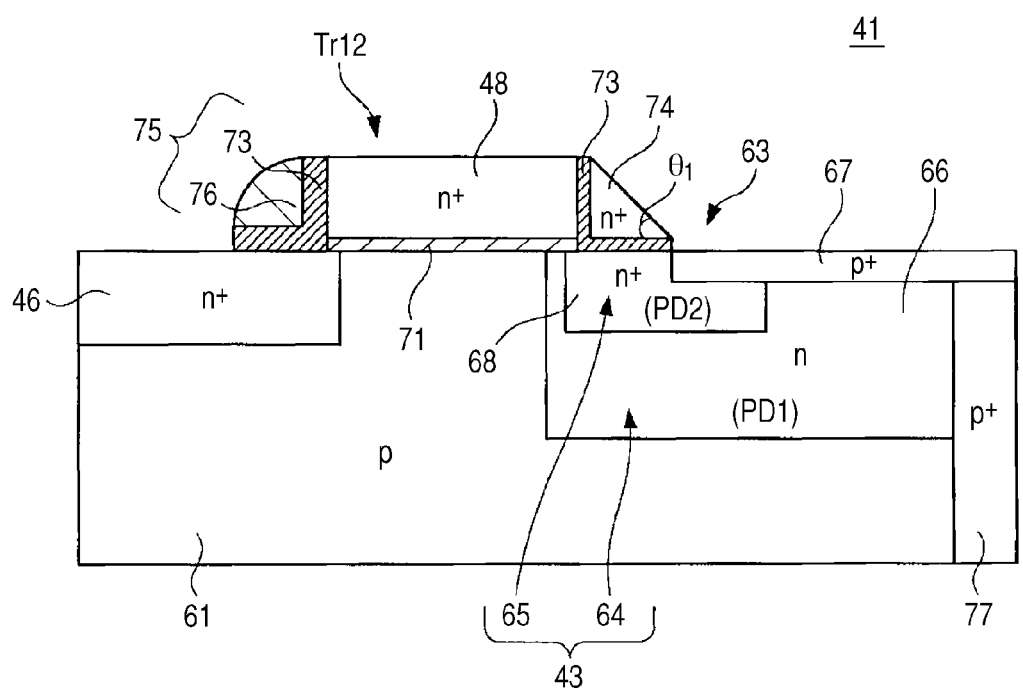
FIG. 4 is a configuration view showing a solid-state imaging device according to a second embodiment of the invention.

FIG. 4 shows a solid-state imaging device according to a second embodiment of the invention, particularly shows the readout portion thereof according to the second embodiment. FIG. 4 is a sectional view of a pixel layout of FIG. 5 as well as the sectional view taken along A-A line in FIG. 6 (which is an enlarged view of a relevant part in FIG. 5).

Figure 5:
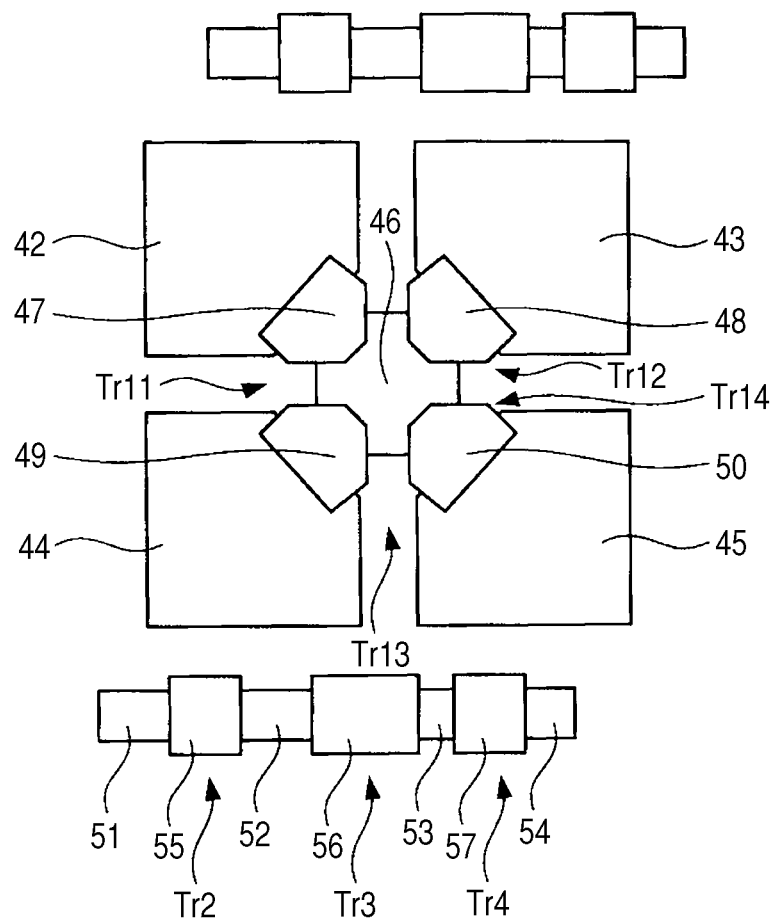
FIG. 5 is a plan view showing an example of a pixel layout applied to the invention.

First, the pixel layout is explained with reference to FIG. 5. The pixel layout of the solid-state imaging device according to the embodiment is a pixel layout in which four photoelectric conversion portions share necessary pixel transistors, that is, four-pixels sharing is one unit. In the solid-state imaging device, four photoelectric conversion portions 42, 43, 44 and 45 are arranged in two columns and in two rows as shown in FIG. 5. One floating diffusion region 46 which is common to the surrounding four photoelectric conversion portions 42 to 45 is arranged at the center.

Transfer gate electrodes 47, 48, 49 and 50 having an approximately triangular shape are formed between respective corner portions of respective four photoelectric conversion portions 42 to 45 and the floating diffusion region 46, and corresponding transfer transistors Tr11, Tr12, Tr13 and Tr14 are formed respectively. The transfer gate electrodes 47 to 50 are formed to be an approximately triangular shape in which the photoelectric conversion portions 42 to 45 side is a bottom edge and the floating diffusion region 46 side is an apex.

Pixel transistors common to the four photoelectric conversion portions 42 to 45, namely, a reset transistor Tr2, an amplification transistor Tr3 and a selection transistor Tr4 are arranged, for example, under the groups of the four photoelectric conversion portions 42 to 45. The reset transistor Tr2 includes a pair of source/drain regions 51, 52 and a reset gate electrode 55 formed through a gate insulating film. The amplification transistor Tr3 includes a pair of source/drain regions 52, 53 and an amplification gate electrode 56 formed through the gate insulating film. The selection transistor Tr4 includes a pair of source/drain regions 53, 54 and a selection gate electrode 57 formed through the gate insulating film.

Figure 6:
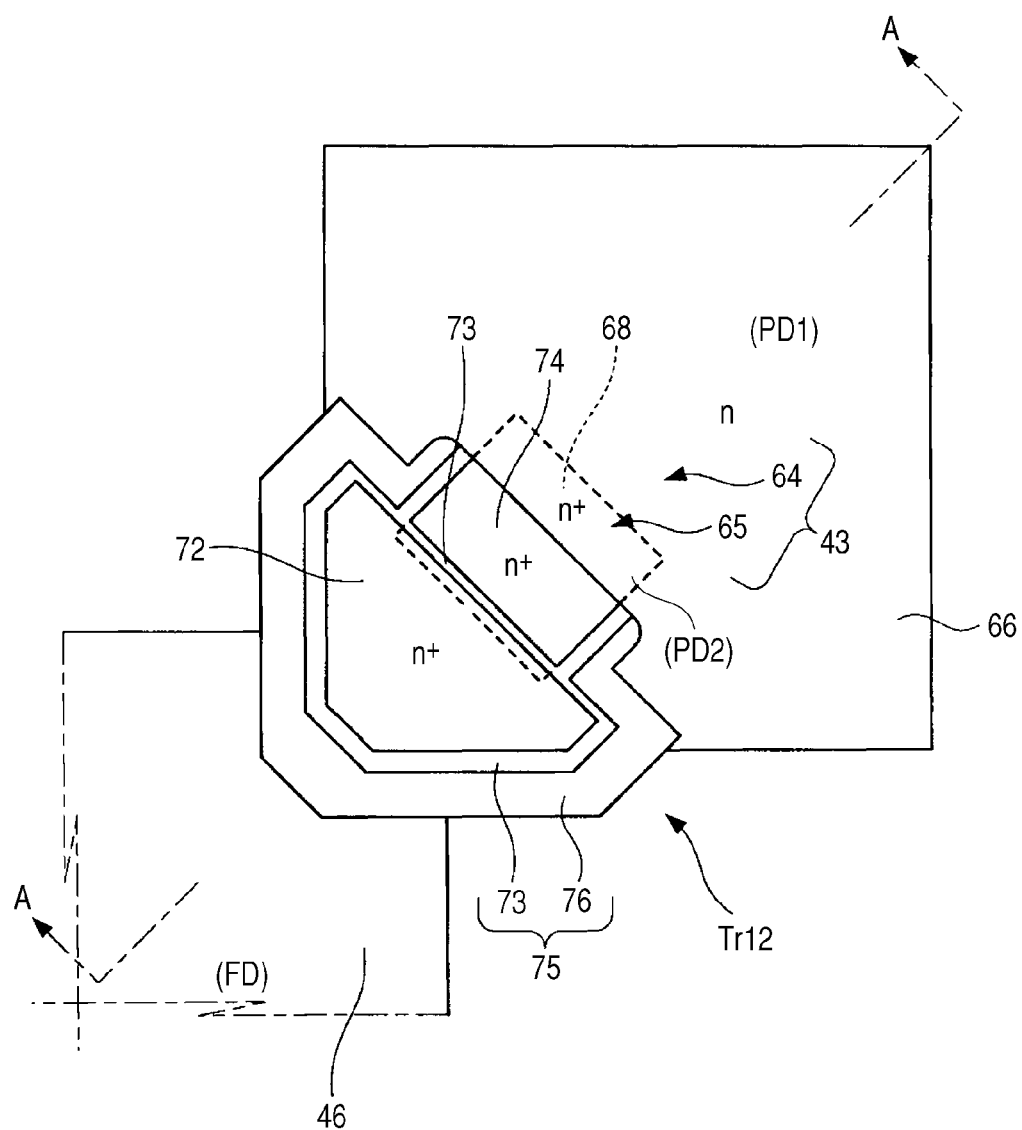
FIG. 6 is an enlarged plan view of a relevant part of FIG. 5.

FIG. 6 shows a detailed configuration of an enlarged one readout portion in FIG. 5. FIG. 4 is a sectional view taken along A-A line of FIG. 6.

In a solid-state imaging device 41 according to the second embodiment, a readout portion 63 including the photoelectric conversion portion 43, the floating diffusion region (FD) 46 which is a second-conductivity n-type semiconductor region and the transfer transistor Tr12 is formed at a region of each unit pixel (each pixel included in the sharing pixels) in a first-conductivity type, p-type semiconductor substrate 61 in the example as shown in FIG. 4.

The transfer transistor Tr12 is constructed by forming an n+gate electrode 48 on a substrate surface between the photoelectric conversion portion 43 and the floating diffusion region 46 through a gate insulating film 71. In the transfer transistor Tr12, the photoelectric conversion portion 43 will be a source region and the floating diffusion region 46 will be a drain region. The gate insulating film 71 is made of, for example, a silicon oxide film.

On the photoelectric conversion portion 43 side of the n+gate electrode 48, an n+poly-sidewall 74 is formed through an insulating film 73, for example, a silicon oxide film. On the floating diffusion region 46 side of the n+gate electrode 48, an insulating sidewall 75 is formed. The insulating sidewall 75 has a two-layer structure in the present example, including, for example, two layers of a silicon oxide film 73 and a silicon nitride film 76. The insulating sidewall 75 may be formed in a one-layer structure or in a multi-layer structure of two or more layers.

Particularly in the embodiment, the photoelectric conversion portion 43 includes a first photodiode (PD1) 64 and a second photodiode (PD2) 65. The first photodiode 64 is constructed as a buried photodiode including an n-type semiconductor region 66 which is a second-conductivity type and a p-type accumulation layer 67 on the surface thereof. The second photodiode 65 is constructed as a photodiode including an n-type semiconductor region 68 which is the second-conductivity type and a region the surface of which is in the hole pinning mode by the n+poly-sidewall 74.

That is to say, the second photodiode 65 is constructed as a photodiode in which charges opposite to signal charges are excited at the surface by an electric field of the transfer gate electrode which will be become clear later or by the poly-sidewall.

The first photodiode 64 is formed over a region in which the photoelectric conversion portion 43 is formed. The second photodiode 65 is formed to be shallower than the first photodiode 64, so as to include higher impurity concentration than the impurity concentration of the first photodiode 64 as well as formed in the vicinity of the n+gate electrode 48. That is to say, in the second photodiode 65, the n-type semiconductor region 68 is formed to be shallower than the n-type semiconductor region 66 of the first photodiode 64. Further, the n-type semiconductor region 68 is formed so that the impurity concentration is set to be higher than the impurity concentration of the n-type semiconductor region 66 of the first photodiode 64 as well as formed in the vicinity of the n+gate electrode 48.

The p-type accumulation layer 67 of the first photodiode 64 is formed so as to extend over the n-type semiconductor region 68 of the second photodiode 65, however, it is not formed just under the n+poly sidewall 74. The p-type accumulation layer 67 may be formed so as to slightly enter a region just under the n+poly sidewall 74.

In the example, the n-type semiconductor region 66 of the first photodiode 64 is formed so as to enter a region just under the n+gate electrode 48 in a manner in which part thereof overlaps with the n+gate electrode 48. The n-type semiconductor region 68 of the second photodiode 65 exists in the n-type semiconductor region 66 of the first photodiode 64 and is formed so as to enter the just under the n+gate electrode 48 in a manner in which part thereof overlaps with the n+gate electrode 48. An element isolation portion 77 is made of the first-conductivity type semiconductor layer, namely, the p-type semiconductor layer in the example.

The silicon oxide film 73 on the n+poly sidewall 74 side is formed to be thinner than the silicon oxide film 73 of the insulating sidewall 75. The n+poly sidewall 74 is formed so as to be a triangular shape inclined in 45 degrees in the shown example, namely, the triangular shape taper angle θ1 of which is 45 degrees. The taper angle θ1 in the n+poly sidewall 74 is preferably 40 to 50 degrees. The n+poly sidewall 74 may be formed to be a circular arc shape like the insulating sidewall 75.

The formation of the reading portion 63 in the embodiment is performed by a self-align process. That is, after forming the n+gate electrode 48, the n-type semiconductor region 66 of the first photodiode 64 is formed by ion implantation through the n+gate electrode 48 and a first photoresist mask. Then, the floating diffusion region 46 is formed by ion implantation through the n+gate electrode 48 and a second photoresist mask. The n-type semiconductor region 68 of the second photodiode 65 is formed by ion implantation through the n+gate electrode 48 and a third photoresist mask. Further, after forming the insulating sidewall 75 and the n+poly sidewall 74 including the insulating film 73, the p-type accumulation layer 67 of the first photodiode 64 is formed through the n+poly sidewall 74 and a fourth photoresist mask.

In the solid-state imaging device according to the second embodiment, signal charges (electrons in the example) generated by photoelectric conversion in the first and second photodiodes 64, 65 during the accumulation period are accumulated in the n-type semiconductor region 68 of the second photodiode 65 having high impurity concentration. That is, signal charges are accumulated in the region close to the n+gate electrode 48.

At the time of reading signal charges, signal charges are accumulated in the second photodiode 65 which is close to the n+gate electrode 48 as well as the shallow region, therefore, the potential of the second photodiode 65 is easily modulated immediately when the readout voltage is applied, which makes the readout of signal charges easy. Furthermore, since the potential barrier is not generated just under the n+poly sidewall 74 because the p-type accumulation layer does not exist at the surface of the second photodiode 65 as well as due to the potential of the n+poly sidewall 74, it is easy to read signal charges. That is, at the time of reading charges, positive voltage is applied to the n+gate electrode 48 to turn on the transfer transistor Tr12.

Also at the time of turning on the transistor, the potential of the n+poly sidewall 74 is modulated by the coupling capacitance in the same manner as the first embodiment, the potential is modulated to be the potential having a gentle slope without the potential barrier just under the n+poly sidewall 74. Therefore, it becomes further easier to read signal charges in cooperation with the above phenomena. In short, the readout of signal charges can be performed in low voltage and readout characteristics are improved.

The film thickness of the insulating film (for example, the silicon oxide film) 73 on the n+poly sidewall 74 side is formed to be thinner than the film thickness of the silicon oxide film 73 of the insulating sidewall 75. Accordingly, the coupling capacitance between the n+gate electrode 48 and the n+poly sidewall 74 is increased, as a result, the coupling is performed easily as well as the potential modulation to the surface of the second photodiode 65 by the n+poly sidewall 74 can be easily performed.

The film thickness of the insulating film 73 on the n+poly sidewall 74 side is a parameter for controlling effects of the n+poly sidewall such as the coupling capacitance and the potential modulation. As parameters for controlling effects of the n+poly sidewall, there are the impurity concentration of the n+poly sidewall 74 and the overhang size of the insulating film 73 and the n+poly sidewall 74 to the photodiode (PD) side. Furthermore, the interaction of an impurity profile in the Si substrate in the vicinity of the gate electrode of the transfer transistor and the n+poly sidewall can control effects of the n+poly sidewall.

In the second embodiment, it is possible to increase a saturated charge amount Qs by providing the second photodiode 65 in which the n-type semiconductor region 68 having high impurity concentration. The solid-state imaging device according to the embodiment has a configuration in which readout of signal charges is easy although the saturated charge amount Qs is large.

Figure 7:
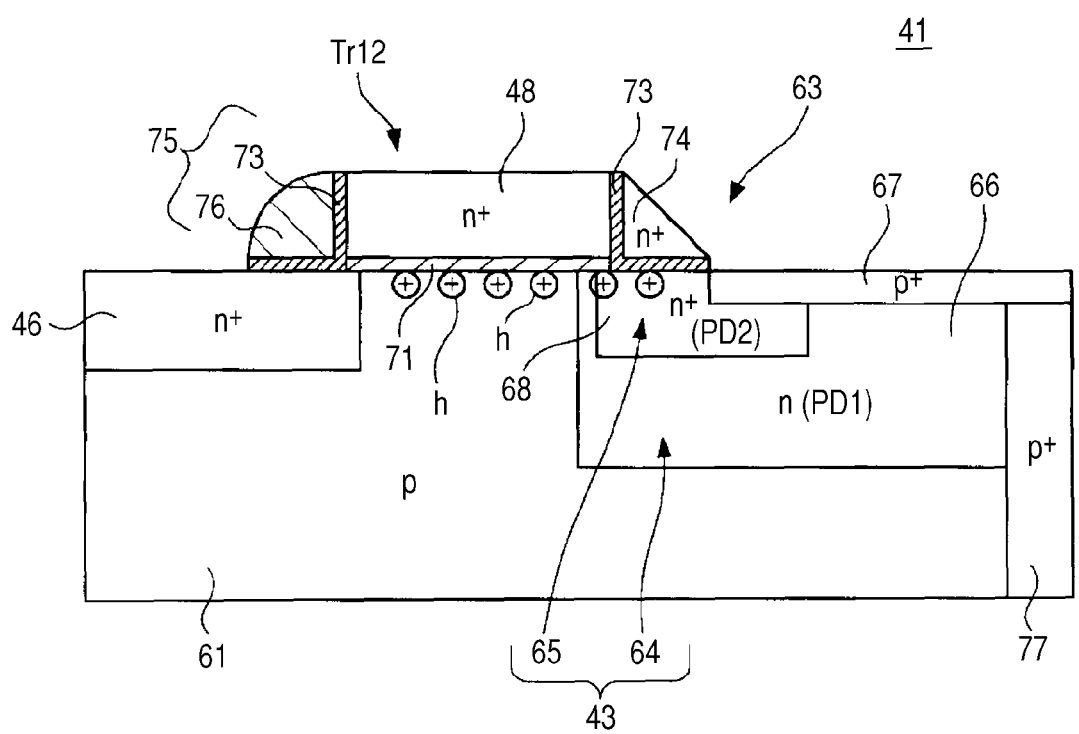
FIG. 7 is a cross-sectional view for explaining the solid-state imaging device according to the second embodiment of the invention.

During the charge accumulation period, negative voltage is applied to the n+gate electrode 48. The negative voltage is also applied to the n+poly sidewall 74 by the coupling capacitance, therefore, holes "h" are induced at the surface of the n-type semiconductor area 68 of the second photodiode 65 just under the n+poly sidewall 74. That is, an accumulation region by the holes "h" induced by the electric field from the n+poly sidewall 74 is formed at the surface of the n-type semiconductor region 68 just under the n+poly sidewall 74 as shown in FIG. 7. The surface of the n-type semiconductor region 68 becomes in the hole pinning mode. At the same time, the channel surface just under the n+gate electrode 48 also becomes in the hole pinning mode. Since the channel surface and the surface of the n-type semiconductor region 68 of the second diode 65 just under the n+poly sidewall 74 become in the hole pinning mode, electrons generated from the insulating film interface are coupled with the holes "h" again, which suppresses generation of white spots.

The second embodiment includes the configuration including the n+gate electrode 48 and the n+poly sidewall 74, therefore, the same effects as the first embodiment can be also realized.

The whole readout portion 63 including the transfer transistor Tr12, the first and second photodiodes 64, 65 is formed by the self-align process, therefore, it is possible to form the readout portion 63 accurately even when pixels are miniaturized, as a result, the solid-state imaging device of the embodiment can be manufactured with high accuracy.

The following effects can be achieved by forming the n+poly sidewall 74 in a triangular shape. It is necessary to remove n+poly sidewalls in unnecessary portions after forming the n+poly sidewall 74. For example, it is necessary to remove n+poly sidewalls at the peripheral circuits because transistor characteristics deteriorate when the n+poly sidewall remains there. When an insulating sidewall is formed after the removal, the insulating sidewall is formed outside the n+poly sidewall at a portion where the n+poly sidewall remains. Since incomplete sidewalls are formed at unintended portions, it is difficult to control the shape and characteristics variations are caused.

On the other hand, when the n+poly sidewall 74 is formed in the triangular shape, the insulating sidewall is not formed outside the n+poly sidewall 74, therefore, it is possible to control the shape and characteristics variations are not caused.

If the shape can be controlled, the insulating sidewall may remain. In that case, the shape of the n+poly sidewall 74 may be shapes other than the triangular shape. It is also possible that the ion implantation of the source/drain of the peripheral circuit is performed by using the n+poly sidewall and the gate electrode as a mask, after that, n+poly sidewalls at unnecessary portions are removed to save the process of forming the insulating sidewall.

Figure 8:
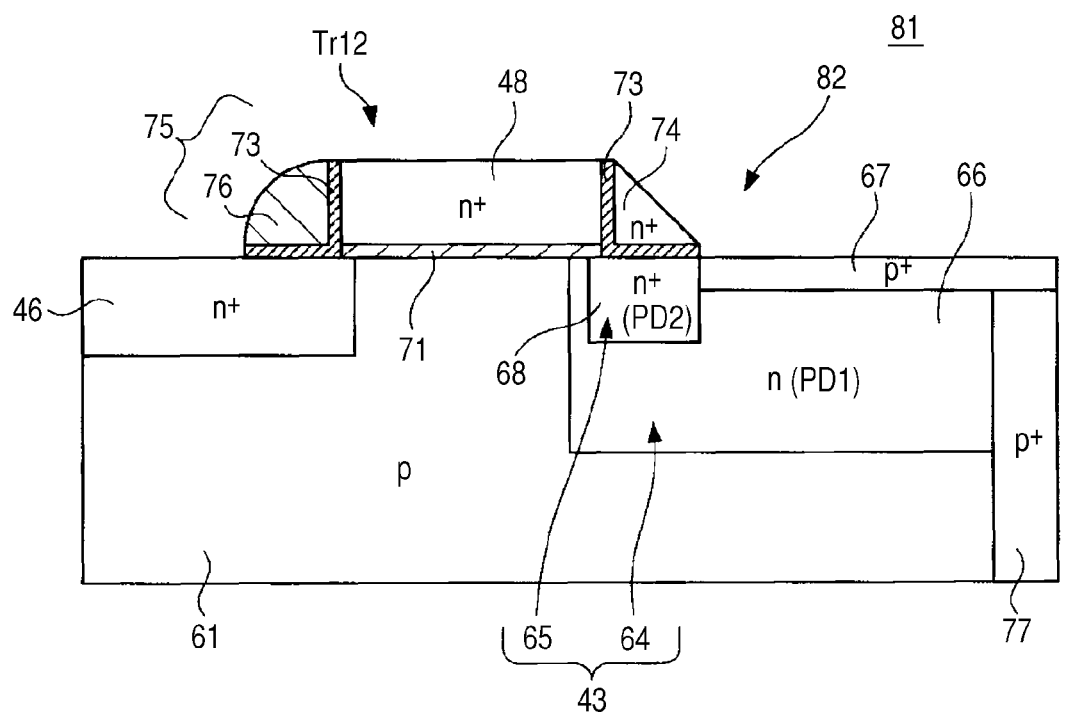
FIG. 8 is a configuration view showing a solid-state imaging device according to a third embodiment of the invention.
Figure 9:
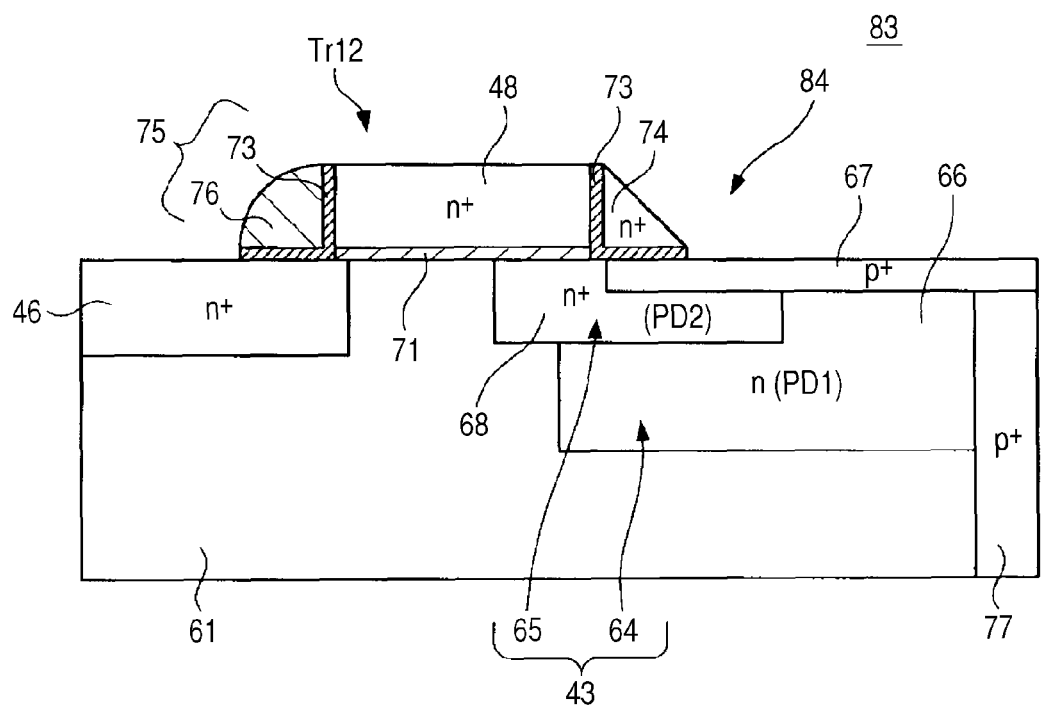
FIG. 9 is a configuration view showing a solid-state imaging device according to a fourth embodiment of the invention.
Figure 10:
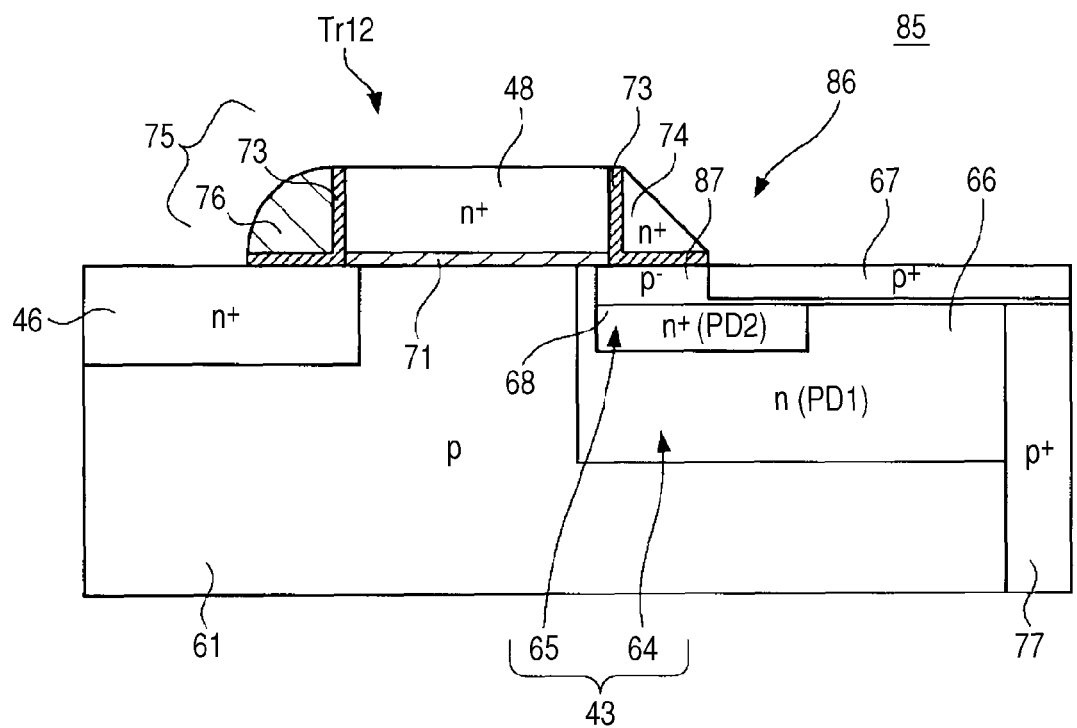
FIG. 10 is a configuration view showing a solid-state imaging device according to a fifth embodiment of the invention.

Modification examples of the second embodiment, namely, a third embodiment, a fourth embodiment and a fifth embodiment will be shown in FIG. 8 to FIG. 10.

In a solid-state imaging device 81 according to the third embodiment, a readout portion 82 is formed by including the photoelectric conversion portion 43 having the first photodiode (PD1) 64 and the second photodiode (PD2) 65, the floating diffusion region 46 and the transfer transistor Tr12 in the same manner as the second embodiment as shown in FIG. 8.

In the present embodiment, the second photodiode 65 is formed just under the n+poly-sidewall 74. That is, the n-type semiconductor region 68 of the second photodiode 65 is formed just under the n+poly-sidewall 74. The p-type accumulation layer 67 of the first photodiode 64 does not overlap with the n-type semiconductor region 68 of the second photodiode 65.

As other configurations are the same as the second embodiment of FIG. 4, the same numbers are given to portions corresponding to FIG. 4 and repeated explanations are omitted.

In the solid-state imaging device 81 according to the third embodiment, the region of the second photodiode 65 is formed to be further narrower than the second embodiment, therefore, accumulated charges are more close to the n+gate electrode 48, which makes readout of signal charges easier. Other effects as explained in the second embodiment are also achieved.

In a solid-state imaging device 83 according to the fourth embodiment, a readout portion 84 is formed by including the photoelectric conversion portion 43 having the first photodiode (PD1) 64 and the second photodiode (PD2) 65, the floating diffusion region 46 and the transfer transistor Tr12 in the same manner as the second embodiment as shown in FIG. 9.

In the present embodiment, part of the n-type semiconductor region 68 of the second photodiode 65 is formed beyond the n-type semiconductor region 66 of the first photodiode 64 so as to extend to the n+gate electrode 48 side. The n-type semiconductor region 68 can be formed by, for example, a tilted ion implantation. The remaining part of the n-type semiconductor region 68 of the second photodiode 65 is formed in the n-type semiconductor region 66 of the first photodiode 64. The p-type accumulation layer 67 of the first photodiode 64 is also formed at a region just under the n+poly-sidewall 74. It is also preferable to apply a configuration in which the p-type accumulation layer 67 is not formed at the region just under the n+poly-sidewall 74.

As other configurations are the same as the second embodiment in FIG. 4, the same numbers are given to portions corresponding to FIG. 4 and repeated explanations are omitted.

In the solid-state imaging device 83 according to the fourth embodiment, the second photodiode 65 is formed so that part thereof extends from the first photodiode 64 to the n+gate electrode 48 side. In the configuration, the second photodiode 65 is further close to the floating diffusion region 46 and the region in the second photodiode 65 modulated by the n+gate electrode 48 is increased, which makes readout of signal charges further easier. Other effects as explained in the second embodiment are also achieved.

In a solid-state imaging device 85 according to the fifth embodiment, a readout portion 86 is formed by including the photoelectric conversion portion 43 having the first photodiode (PD1) 64 and the second photodiode (PD2) 65, the floating diffusion region 46 and the transfer transistor Tr12 in the same manner as the second embodiment as shown in FIG. 10.

In the embodiment, the first photodiode 64 and the second photodiode 65 are formed in the same positional relationship as the second embodiment shown in FIG. 4, and a p-type low impurity concentration region 87 is formed at the surface of the second photodiode 65 just under the n+poly-sidewall 74. That is, the p-type low impurity concentration region 87 having lower concentration than the p-type accumulation layer 67 of the first photodiode 64, a so-called low concentration p-accumulation layer is formed at the surface of the n-type semiconductor region 68 of the second photodiode 65 just under the n+poly-sidewall 74.

As other configurations are the same as the second embodiment of FIG. 4, the same numbers are given to portions corresponding to FIG. 4 and repeated explanations are omitted.

In the solid-state imaging device 85 according to the fifth embodiment, the p-type semiconductor region 87 to be the p-accumulation layer is formed, therefore, it is possible to suppress generation of white spots in cooperation with the hole induction at the surface of the second photodiode 65 by the n+poly-sidewall 74. In addition, the same effects as the second embodiment such as the easiness of reading signal charges, the increase of the saturated charge amount and the like can be obtained.

Figure 11:
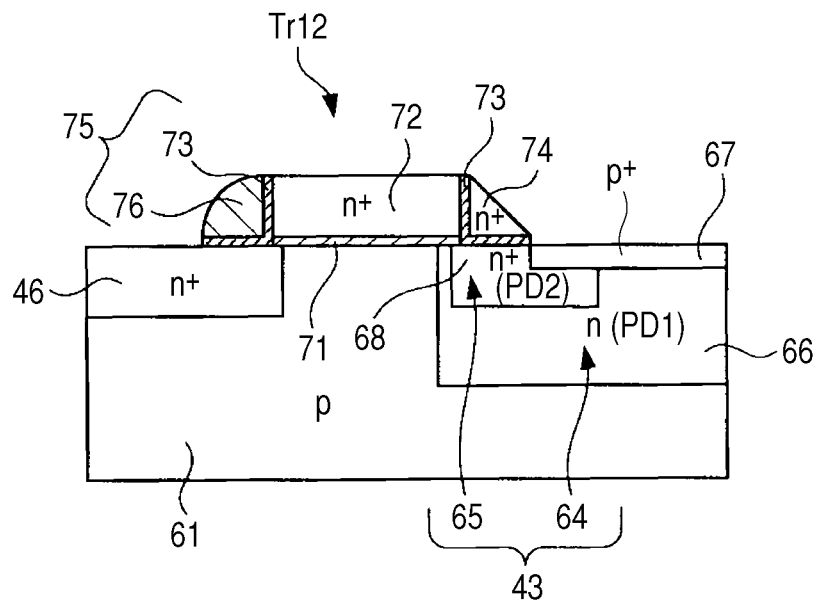
FIG. 11 is a configuration view showing an example of a transfer gate electrode of the solid-state imaging device according to an embodiment of the invention.
Figure 12:
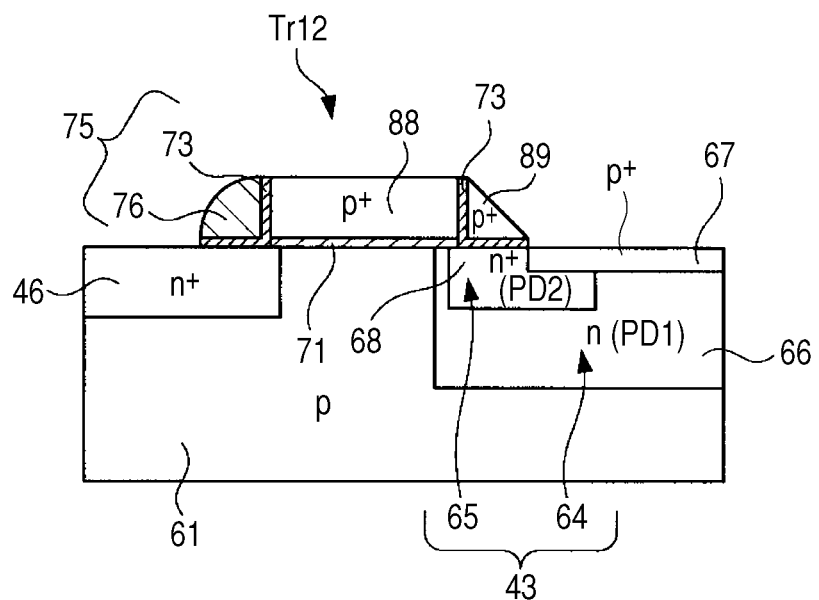
FIG. 12 is a configuration view showing an example of a transfer gate electrode of the solid-state imaging device according to an embodiment of the invention.
Figure 13:
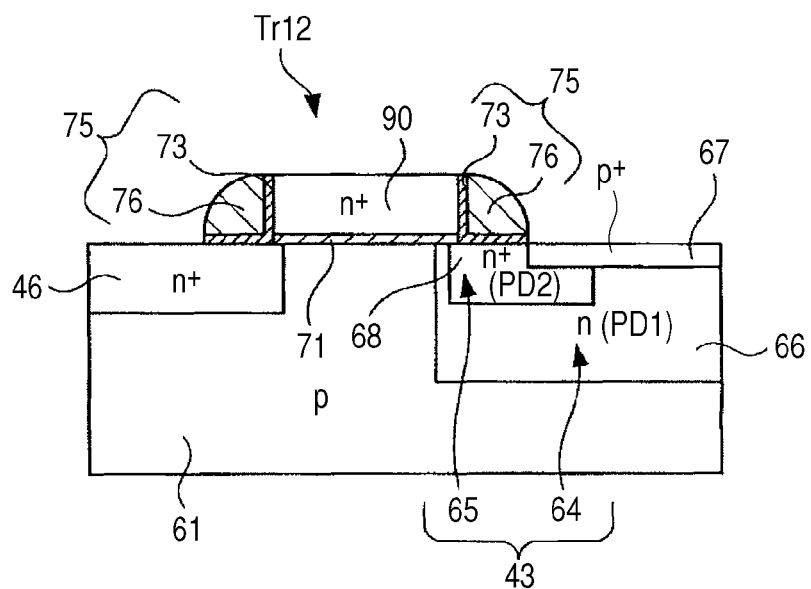
FIG. 13 is a configuration view showing an example of a transfer gate electrode of the solid-state imaging device according to an embodiment of the invention.

In the solid-state imaging device having the photoelectric conversion portion 43 including the first photodiode 64 and the second photodiode 65, configurations shown in FIG. 11 to FIG. 13 can be applied as configurations of the gate electrode of the transfer transistor and the sidewalls.

In the example of FIG. 11, the transfer gate electrode of the transfer transistor is made of an n+gate electrode 72 in the same manner as explained in FIG. 4. A sidewall on the photoelectric conversion portion 43 side is made of the n+polysidewall 74 including the insulating film (for example, a silicon oxide film) 73. A sidewall on the floating diffusion region 46 side is made of the insulating sidewall 75 which includes two layers of the silicon oxide film 73 and the silicon nitride film 76 in the example.

In the example of FIG. 12, the transfer gate electrode of the transfer transistor is made of a p+gate electrode 88. A sidewall on the photoelectric conversion portion 43 side is made of a p+poly sidewall 89 including the insulating film (for example, the silicon oxide film) 73. A sidewall on the floating diffusion region 46 side is made of the insulating sidewall 75 which includes two layers of the silicon oxide film 73 and the silicon nitride film 76 in the example. The sidewall on the photoelectric conversion portion 43 side can be also made of an n+poly sidewall 89 including the insulating film (for example, the silicon oxide film) 73.

In the case of the configuration including the p+gate electrode 88 and the p+poly sidewall 89 as shown in FIG. 12, it is possible to make the surface just under the p+poly sidewall 89 be in the pinning mode due to effects of the work function difference with respect to "n+" even when the gate voltage is 0V.

In the example of FIG. 13, a transfer gate electrode 90 of the transfer transistor is made of a gate electrode of a necessary conductivity-type which is a p+gate electrode or an n+gate electrode. A sidewall on the photoelectric conversion portion 43 side and a sidewall on the floating diffusion region 46 side are both made of the insulating sidewall 75 including two layers of the silicon oxide film 73 and the silicon nitride film 76 in the example.

In the example, the surface of the second photodiode 65 becomes in the hole pinning mode due to an electric field by the transfer gate electrode 90.

Furthermore, as a configuration of the gate electrode of the transfer transistor and the sidewalls, a configuration in which the insulating sidewall 75 on the floating diffusion region 46 side does not exist in the configurations of FIG. 11 to FIG. 13 can be applied though not shown.

The configuration of the photoelectric conversion portion 43 including the first and second photodiodes 64, 65 can be any of configurations shown in FIG. 8 to FIG. 10.

Though the above embodiments are constructed by regarding signal charges as electrons, it is possible to regard signal charges as positive holes (holes). In this case, conductivity types of respective semiconductor regions will be opposite conductivity types with respect to the above examples.

The solid-state imaging device according to an embodiment of the invention is not limited to the application of an area image sensor in which pixels are two-dimensionally arranged in a matrix state, but can be also applied to a linear image sensor in which pixels are one-dimensionally arranged on a straight line in the same manner.

The solid-state imaging device according to an embodiment of the invention can be applied to electronic apparatuses such as a camera, a cellular phone with a camera including the solid-state imaging device, and other apparatuses including the solid-state imaging device.

Figure 14:
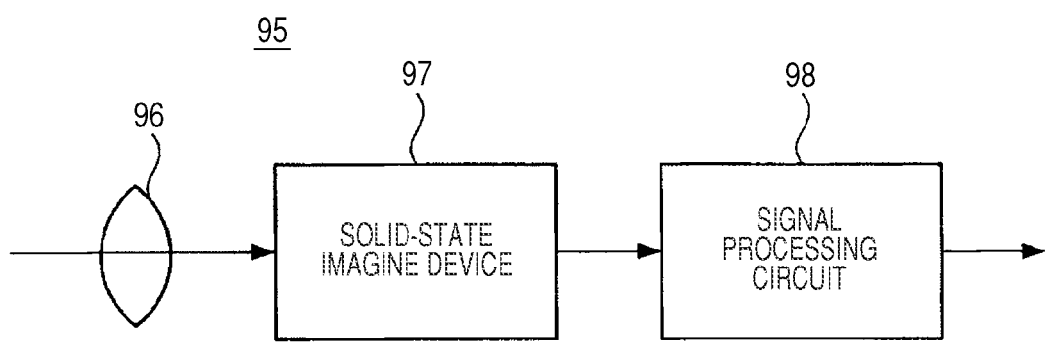
FIG. 14 is a schematic configuration view of an electronic apparatus according to an embodiment of the invention.
Figure 15:
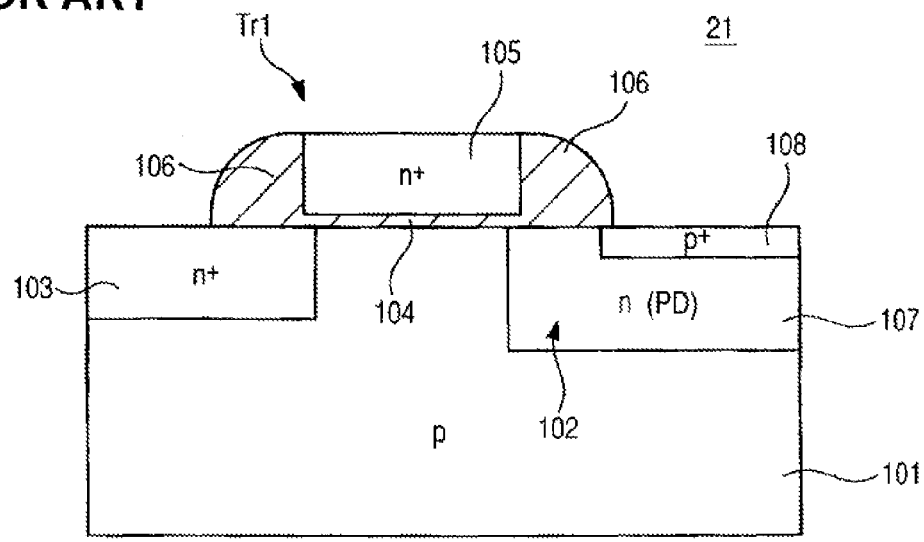
FIG. 15 is a configuration view showing a readout portion of a solid-state imaging device according to a related art example.
Figure 16:
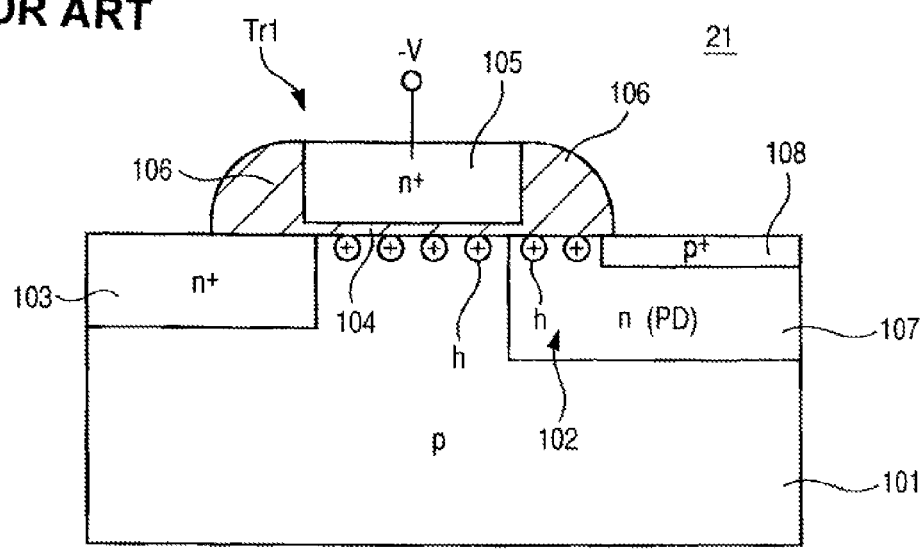
FIG. 16 is a configuration view showing a readout portion of a solid-state imaging device according to another related art example.

FIG. 14 shows an embodiment in which the solid-state imaging device is applied to the camera as an electronic apparatus of an example of the invention. A camera 95 according to the embodiment includes an optical system (optical lens) 96, a solid-state imaging device 97 and a signal processing circuit 98. As the solid-state imaging device 97, any one of solid-state imaging devices of the above embodiments is applied. The optical system 96 images image light (incident light) from a subject on an imaging surface of the solid-state imaging device 97. Accordingly, signal charges are accumulated for a fixed period in photoelectric conversion elements of the solid-state imaging device 97. The signal processing circuit 98 performs various signal processing to output signals of the solid-state imaging device 97 and outputs them. The camera 95 of an embodiment in the invention includes a form of a camera module in which the optical system 96, the solid-state imaging device 97 and the signal processing circuit 98 are constructed as a module.

The invention can be applied to the camera shown in FIG. 14, the cellular phone with the camera and the like typified by, for example, the cellular phone having the camera module.

Furthermore, the configuration of FIG. 14 can be realized as a module including an imaging function in which the optical system 96, the solid-state imaging device 97 and the signal processing circuit 98 are constructed as a module, that is, as the imaging function module. The invention can form an electric apparatus including the imaging function module.

The electric apparatus according to an embodiment of the invention is excellent in readout characteristics in the solid-state imaging device as well as in pixel characteristics, which realizes readout in low voltage. Additionally, it is possible to provide the electric apparatus having high image quality, in which the generation of white spots is suppressed or the saturated charge amount is increased.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising a photoelectric conversion portion including a first photodiode and a second photodiode in a unit pixel;
   wherein,
   a first-conductivity type accumulation layer of the first photodiode is formed so as to extend over a portion of a second-conductivity type semiconductor region of the second photodiode, and
   the second photodiode is positioned in the vicinity of a transfer gate electrode and has a higher impurity concentration than the first photodiode.

2. The solid-state imaging device according to claim 1, wherein:
   the first photodiode is constructed as a buried photodiode in which an accumulation region having a conductivity type opposite to a charge accumulation region is formed at the surface, and
   the second photodiode is constructed as a photodiode in which charges opposite to signal charges are induced at the surface due to an electric field by the transfer gate electrode or a sidewall made of a semiconductor formed at the transfer gate electrode through an insulating film.

3. The solid-state imaging device according to claim 2, wherein a sidewall made of a necessary conductive-type semiconductor is formed on the second photodiode side of the transfer gate electrode.

4. The solid-state imaging device according to claim 1, wherein the second photodiode is constructed as a photodiode in which charges opposite to signal charges are induced at the surface due to an electric field from the sidewall made of a semiconductor and formed at the transfer gate electrode through an insulating film.

5. An electronic apparatus comprising:
   a solid-state imaging device;
   an optical system which guides incident light to photoelectric conversion portions of the solid-state imaging device; and
   a signal processing circuit which processes output signals of the solid-state imaging device,
   wherein,
   a first-conductivity type accumulation layer of the first photodiode is formed so as to extend over a portion of a second-conductivity type semiconductor region of the second photodiode,
   the solid-state imaging device includes a photoelectric conversion portion including a first photodiode and a second photodiode in a unit pixel, and
   the second photodiode is positioned in the vicinity of a transfer gate electrode and has a higher impurity concentration than the first photodiode.

6. The electronic apparatus according to claim 5, wherein:
   in the solid-state imaging device, the first photodiode is constructed as a buried photodiode in which an accumulation region having a conductivity type opposite to a charge accumulation region is formed at the surface, and
   the second photodiode is constructed as a photodiode in which charges opposite to signal charges are induced at the surface due to an electric field by the transfer gate electrode or a sidewall by a semiconductor formed at the transfer gate electrode through an insulating film.

* * * * *